United States Patent
Lee et al.

(10) Patent No.: US 11,635,215 B2
(45) Date of Patent: Apr. 25, 2023

(54) OUTDOOR UNIT AND AIR CONDITIONER HAVING THE SAME

(71) Applicant: SAMSUNG ELECTRONICS CO., LTD., Suwon-si (KR)

(72) Inventors: In Chul Lee, Suwon-si (KR); Jeong Uk Koh, Suwon-si (KR); Yong Sam Kwon, Suwon-si (KR); Hyo Jin Kim, Suwon-si (KR); Seong Jin Cho, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 171 days.

(21) Appl. No.: 16/657,132

(22) Filed: Oct. 18, 2019

(65) Prior Publication Data

US 2020/0124298 A1  Apr. 23, 2020

(30) Foreign Application Priority Data

Oct. 18, 2018 (KR) ........................ 10-2018-0124735

(51) Int. Cl.
*F24F 1/56* (2011.01)
*H05K 5/03* (2006.01)
*H05K 5/02* (2006.01)

(52) U.S. Cl.
CPC ............. *F24F 1/56* (2013.01); *H05K 5/0226* (2013.01); *H05K 5/03* (2013.01)

(58) Field of Classification Search
CPC ............ F24F 1/56; H05K 5/03; H05K 5/0226
USPC ........................................................ 312/100
See application file for complete search history.

(56) References Cited

U.S. PATENT DOCUMENTS

| 2,920,682 | A | * | 1/1960 | Lindberg | ............ B29C 65/7802 446/88 |
| 7,428,122 | B2 | | 9/2008 | Kimura et al. | |
| 8,464,548 | B2 | * | 6/2013 | Okuda | ................... F24F 13/20 62/259.2 |

(Continued)

FOREIGN PATENT DOCUMENTS

| CN | 201340032 Y | 11/2009 |
| CN | 204648517 U | 9/2015 |

(Continued)

OTHER PUBLICATIONS

International Search Report dated Mar. 4, 2020 in International Patent Application No. PCT/KR2019/013585.

(Continued)

*Primary Examiner* — James O Hansen
(74) *Attorney, Agent, or Firm* — Staas & Halsey LLP

(57) ABSTRACT

Disclosed is an air conditioner including a first frame including a through hole, a second frame rotatably coupleable to the first frame, the second frame including a burring portion at least a portion of which is insertable into the through-hole in a first direction, where while the burring portion is inserted into the through-hole of the first frame, the burring portion protrudes in the first direction, and a burring hole formed by the burring portion, and a fastening member insertable into the burring hole in a second direction opposite to the first direction and configured to function as a rotary shaft of the second frame, where while the fastening member is inserted into the burring hole, the fastening member protrudes in the second direction.

13 Claims, 18 Drawing Sheets

(56) References Cited

U.S. PATENT DOCUMENTS

| | | | |
|---|---|---|---|
| 2013/0057129 A1* | 3/2013 | Jung | D06F 39/12 312/228 |
| 2014/0061216 A1 | 3/2014 | Lee | |
| 2014/0117825 A1* | 5/2014 | Lee | H05K 7/1418 312/237 |
| 2017/0159949 A1* | 6/2017 | Jeon | F24F 13/08 |

FOREIGN PATENT DOCUMENTS

| | | | | |
|---|---|---|---|---|
| CN | 105841256 A | | 8/2016 | |
| CN | 108151187 A | | 6/2018 | |
| EP | 3182023 | * | 6/2017 | ............ F24F 1/22 |
| JP | 57-186438 U | | 11/1982 | |
| JP | 11-179452 A | | 7/1999 | |
| JP | 2003-120636 | | 4/2003 | |
| JP | 2005-78763 | | 3/2005 | |
| JP | 2006-283494 A | | 10/2006 | |
| JP | 2009-85466 A | | 4/2009 | |
| JP | 2010-278270 | | 12/2010 | |
| JP | 2014-9700 a | | 1/2014 | |
| JP | 2014-66462 | | 4/2014 | |
| KR | 20-2000-0016423 | | 9/2000 | |
| KR | 10-2000-0059304 | | 10/2000 | |
| KR | 10-2005-0023603 A | | 3/2005 | |
| KR | 10-0842045 | | 6/2008 | |
| KR | 20-2009-0004868 | | 5/2009 | |
| KR | 10-2014-0029824 | | 3/2014 | |

OTHER PUBLICATIONS

Supplementary European Search Report dated Oct. 12, 2021 in European Application No. 19873588.8.

Office Action dated Apr. 29, 2022 issue in Chinese Application No. 201980068552.7.

Office Action dated Nov. 24, 2022 issued in Korean Application No. 10-2018-0124735.

Office Action dated Dec. 9, 2022 issue in Chinese Application No. 201980068552.7.

* cited by examiner

OUTDOOR UNIT AND AIR CONDITIONER HAVING THE SAME

CROSS-REFERENCE TO RELATED APPLICATION(S)

This application is based on and claims priority under 35 U.S.C. § 119 to Korean Patent Application No. 10-2018-0124735, filed on Oct. 18, 2018, in the Korean Intellectual Property Office, the disclosure of which is incorporated by reference herein in its entirety

BACKGROUND

1. Field

The disclosure relates to an outdoor unit and an air conditioner including the same, and more particularly to an outdoor unit including a hinge type structure having reduced number of elements and improved space utilization, and an air conditioner including the same.

2. Description of Related Art

In general, an air conditioner is a device including a refrigeration cycle, and the air conditioner includes a separate type air conditioner having an indoor unit arranged in an indoor space and an outdoor unit arranged in an outdoor space.

The indoor unit of the air conditioner includes a heat exchanger for exchanging heat with a refrigerant, a blower fan for flowing air, and a motor for driving the blower fan, and thus the air conditioner may cool or heat the indoor space.

The outdoor unit of the air conditioner may include an outdoor heat exchanger for exchanging heat with outdoor air, a compressor for compressing a refrigerant, and a housing for accommodating the outdoor heat exchanger and the compressor. On one side of the housing, a control box where a printed circuit board assembly configured to control the outdoor unit and the indoor unit is placed may be arranged.

In order to improve space utilization, the control box may include a fixed frame fixed to one side of the housing, and a rotating frame rotatably coupled to the fixed frame. The rotating frame may be hinged to the fixed frame.

In general, a separate hinge element is required to allow the rotating frame to be hinged to the fixed frame. In addition, a predetermined space is required for arranging the hinge element. For this reason, the number of elements may increase and space utilization may be degraded.

SUMMARY

Therefore, it is an aspect of the disclosure to provide an outdoor unit including a hinge structure having reduced number of elements and improved space utilization, and an air conditioner including the same.

Additional aspects of the disclosure will be set forth in part in the description which follows and, in part, will be obvious from the description, or may be learned by practice of the disclosure.

In accordance with an aspect of the disclosure, an air conditioner includes a first frame including a through hole, a second frame rotatably coupleable to the first frame, the second frame including a burring portion at least a portion of which is insertable into the through-hole in a first direction, where while the burring portion is inserted into the through-hole of the first frame, the burring portion protrudes in the first direction and a burring hole formed by the burring portion, and a fastening member insertable into the burring hole in a second direction opposite to the first direction and configured to function as a rotary shaft of the second frame, where while the fastening member is inserted into the burring hole, the fastening member protrudes in the second direction.

The first frame further may include a first recess formed around a periphery of the through-hole and recessed in the second direction.

The second frame may further include a second recess formed around a periphery of the burring portion and recessed in the second direction.

The first recess and the second recess may correspond to each other to guide the burring portion to be inserted into the through hole.

The fastening member may be arranged to be spaced apart from the first frame so as not to be in contact with the first frame.

The fastening member may include a body having a thread formed on an outer surface thereof, and a head provided in one end of the body and having a diameter greater than that of the body.

The diameter of the body may be greater than a diameter of the burring hole.

A diameter of the through hole may be less than that of the head to prevent the fastening member from passing through the through hole.

The first frame may further include a boss formed around a periphery of the through hole is bent in the first direction.

The burring portion may protrude more than the boss in the first direction.

The air conditioner may further include a central hole through which the fastening member penetrates, and an elastic member arranged between the burring portion and the fastening member.

A diameter of the central hole may be less than an outer diameter of the burring portion to prevent the burring portion from passing through the central hole.

The air conditioner may further include a first printed circuit board assembly and a second printed circuit board assembly different from the first printed circuit board assembly.

The first printed circuit board assembly may be mounted to the first frame.

The second printed circuit board assembly may be mounted to the second frame.

In accordance with another aspect of the disclosure, an air conditioner includes a fixed frame including a burring hole and a burring portion configured to surround the burring hole and protrude in a first direction, a rotating frame rotatably coupleable to the fixed frame and including a through hole into which the burring portion is inserted, and a fastening member coupleable to the rotating frame by being inserted into the burring hole in a second direction opposite to the first direction, and the burring portion passes through the through hole and protrudes in the first direction.

The fixed frame may further include a first protrusion formed in such a way that the periphery of the burring portion protrudes in the second direction.

The rotating frame may further include a second protrusion formed in such a way that the periphery of the through hole protrudes in the second direction, and the second protrusion corresponds to the first protrusion.

The fastening member may be arranged to be spaced apart from the rotating frame so as not to be in contact with the rotating frame.

The rotating frame may further include a boss formed in such a way that the periphery of the through hole is bent in the first direction.

A length of the burring portion in the first direction may be greater than a length of the boss in the first direction.

The air conditioner may further include a central hole through which the fastening member penetrates, and an elastic member arranged between the burring portion and the fastening member.

A diameter of the central hole may be less than an outer diameter of the burring portion to prevent the burring portion from passing through the central hole.

In accordance with another aspect of the disclosure, an outdoor unit of an air conditioner includes a first frame on which a printed circuit board assembly is mounted and including a through hole, a second frame rotatably coupleable to the first frame, the second frame including a burring portion at least a portion of which is insertable into the through-hole of the first frame in a first direction, and a burring hole formed by the burring portion, and a fastening member insertable into the burring hole in a second direction opposite to the first direction so as to function as a rotary shaft of the second frame, and when the burring portion is inserted into the through-hole of the first frame, the burring portion passes through the through hole so as to protrude in the first direction about the through hole.

BRIEF DESCRIPTION OF THE DRAWINGS

These and/or other aspects of the disclosure will become apparent and more readily appreciated from the following description of embodiments, taken in conjunction with the accompanying drawings of which.

DETAILED DESCRIPTION

Figure 1:
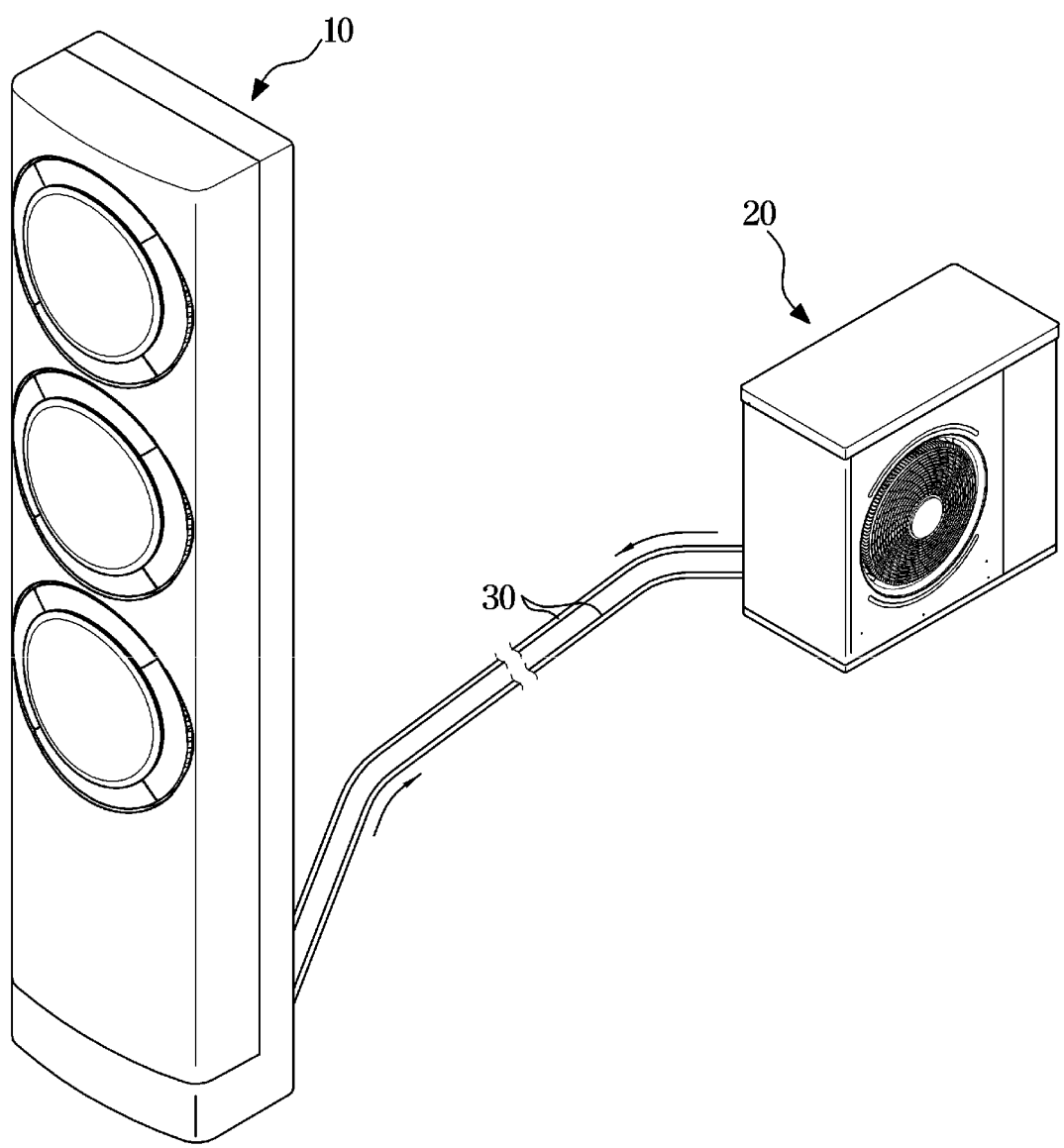
FIG. 1 is a schematic diagram of an air conditioner according to an embodiment of the disclosure.

Embodiments described in the disclosure and configurations shown in the drawings are merely examples of the embodiments of the disclosure, and may be modified in various different ways at the time of filing of the present application to replace the embodiments and drawings of the disclosure.

Also, the terms used herein are used to describe the embodiments and are not intended to limit and/or restrict the disclosure. The singular forms "a," "an" and "the" are intended to include the plural forms as well, unless the context clearly indicates otherwise. In this disclosure, the terms "including", "having", and the like are used to specify features, numbers, steps, operations, elements, components, or combinations thereof, but do not preclude the presence or addition of one or more of the features, elements, steps, operations, elements, components, or combinations thereof.

It will be understood that, although the terms first, second, third, etc., may be used herein to describe various elements, but elements are not limited by these terms. These terms are only used to distinguish one element from another element. For example, without departing from the scope of the disclosure, a first element may be termed as a second element, and a second element may be termed as a first element.

The disclosure will be described more fully hereinafter with reference to the accompanying drawings.

FIG. 1 is a schematic diagram of an air conditioner according to an embodiment of the disclosure.

As illustrated in FIG. 1, an air conditioner according to an embodiment of the disclosure includes an indoor unit 10 arranged in an indoor space and an outdoor unit 20 arranged in an outdoor space. The indoor unit 10 and the outdoor unit 20 are connected to each other through a refrigerant pipe 30 configured to deliver a refrigerant. In addition, although not shown in the drawings, the indoor unit 10 and the outdoor unit 20 are connected to each other through wires configured to transmit power and electric signals.

The indoor unit 10 includes an indoor heat exchanger (not shown) configured to exchange heat with indoor air, an indoor blower fan (not shown) configured to suction and blow indoor air to allow the indoor air to pass through the indoor heat exchanger, and an expansion valve (not shown) configured to decompress and expand a refrigerant.

The outdoor unit 20 includes an outdoor heat exchanger (not shown) configured to exchange heat with outdoor air, an outdoor blower fan (not shown) configured to suction and blow outdoor air to allow the outdoor air to pass through the outdoor heat exchanger, and a compressor (not shown) configured to compress a refrigerant and a housing 21 configured to form an exterior of the outdoor unit 20 and in which the above mentioned outdoor heat exchanger, outdoor blower fan and compressor are placed.

Figure 2:
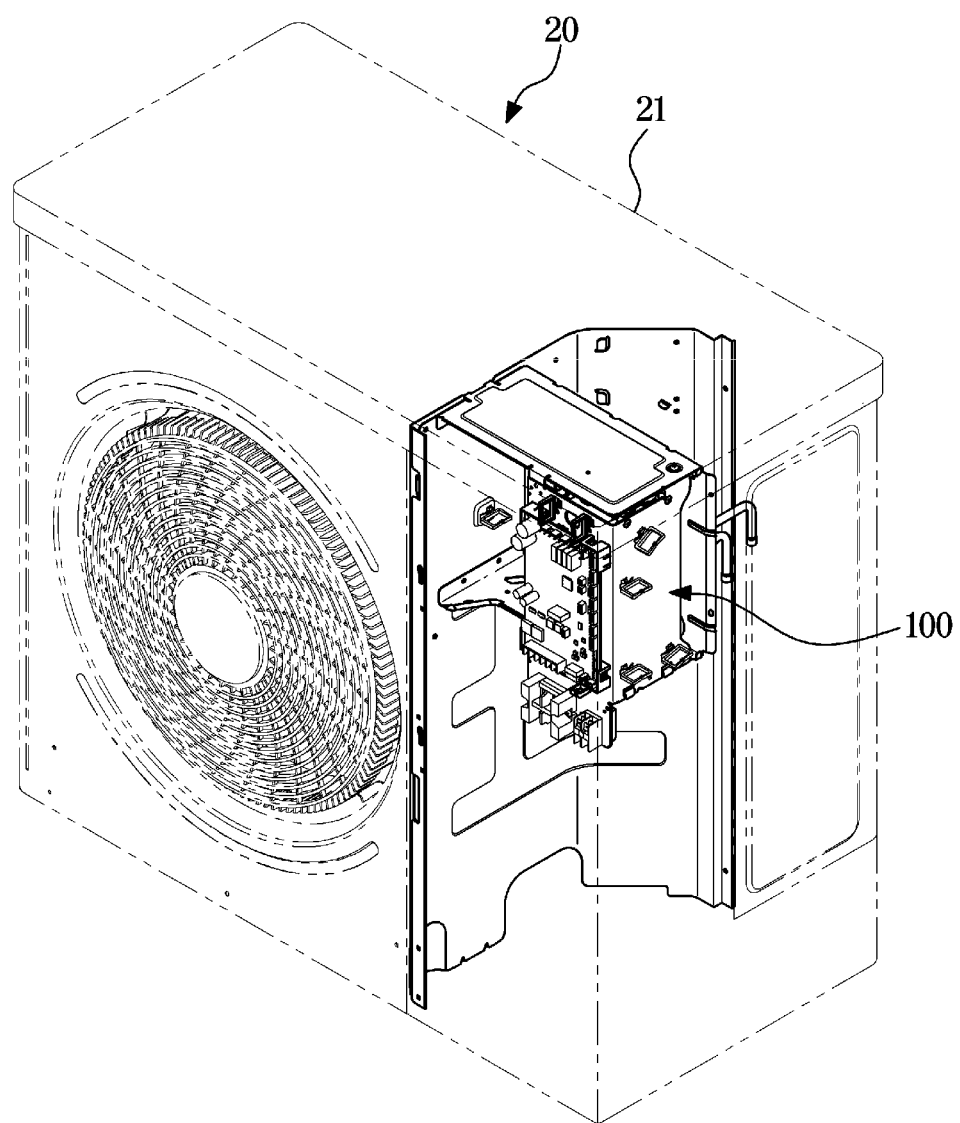
FIG. 2 is a view illustrating a position of a control portion in an outdoor unit of the air conditioner according to an embodiment of the disclosure.

FIG. 2 is a view illustrating a position of a control portion in an outdoor unit of the air conditioner according to an embodiment of the disclosure.

Referring to FIG. 2, the outdoor unit 20 may include a control portion 100 arranged inside the housing 21. The control portion 100 may include a printed circuit board assembly configured to control the outdoor unit 20 and the indoor unit 10.

The control portion 100 may be arranged on one side of the inside of the housing 21. For example, inside the housing 21, the control portion 100 may be arranged on a lateral side of the outdoor blower fan. However, the position of the control portion 100 is not limited thereto. Therefore, the control portion 100 may be arranged at another position inside the housing 21.

Figure 3:
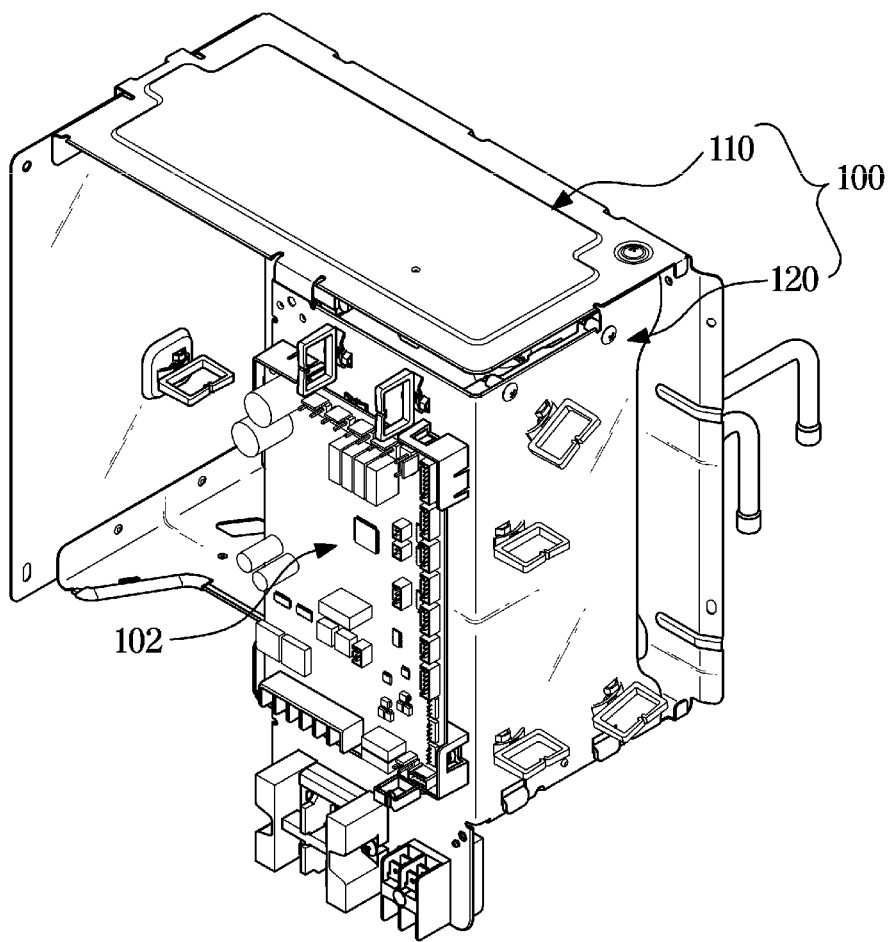
FIG. 3 is a view illustrating the control portion separated from the outdoor unit of the air conditioner according to an embodiment of the disclosure.
Figure 4:
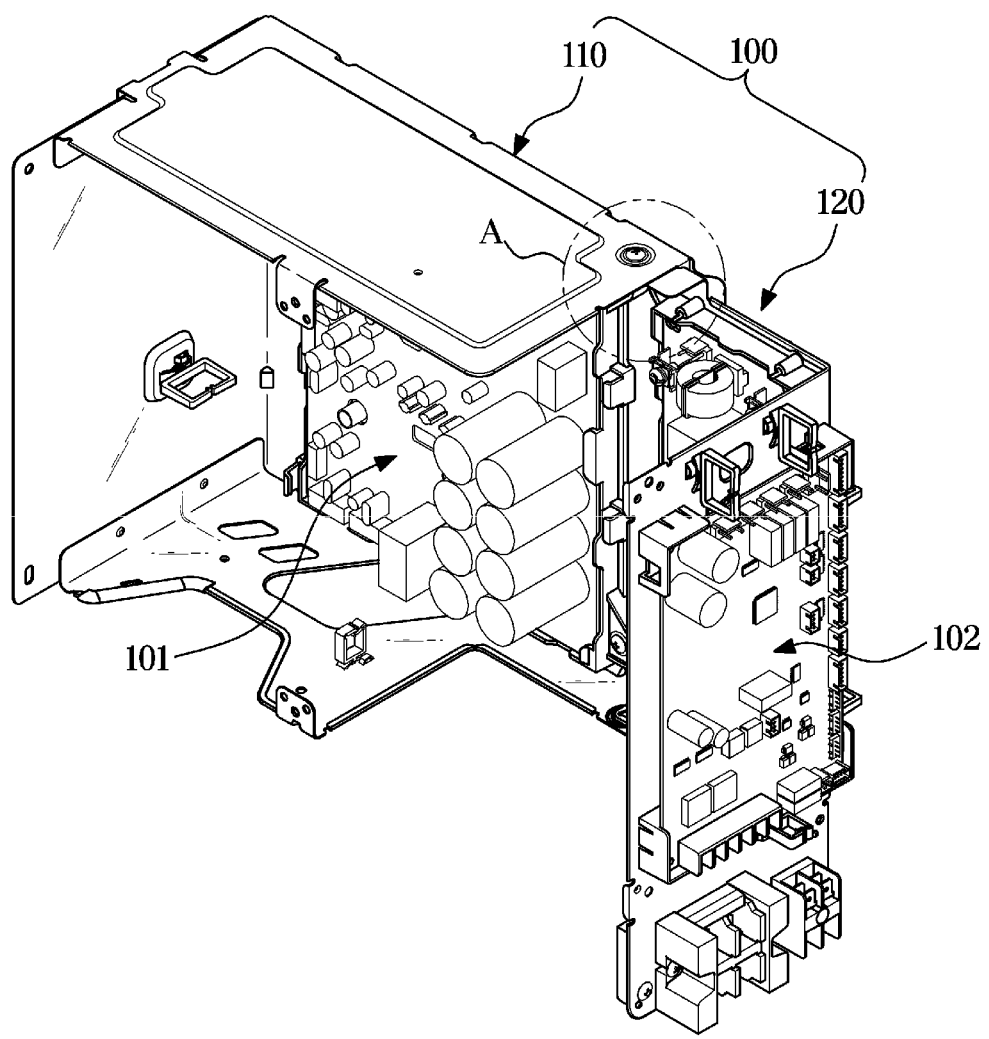
FIG. 4 is a view illustrating a state in which a rotating frame is rotated in the control portion of FIG. 3.

FIG. 3 is a view illustrating the control portion separated from the outdoor unit of the air conditioner according to an embodiment of the disclosure. FIG. 4 is a view illustrating a state in which a rotating frame is rotated in the control portion of FIG. 3.

Figure 5:
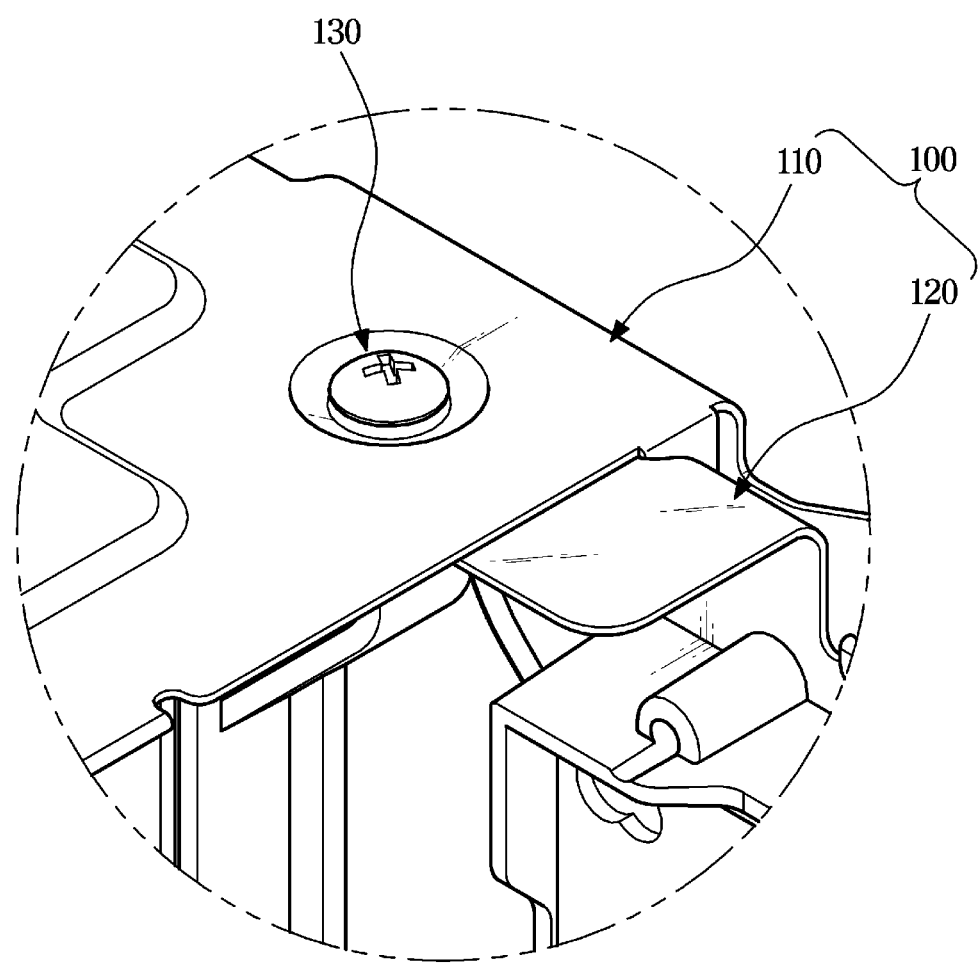
FIG. 5 is an enlarged view of a part A of FIG. 4.

Referring to FIGS. 3 and 4, the control portion 100 according to an embodiment of the disclosure may include a fixed frame 110, a rotating frame 120 and the fastening member 130 (FIG. 5). In addition, the control portion 100 may include a first printed circuit board assembly 101 and a second printed circuit board assembly 102 configured to control the outdoor unit 20 and/or the indoor unit 10.

The fixed frame 110 may be fixed to one side of the housing 21. The fixed frame 110 may accommodate the first printed circuit board assembly 101. In other words, the first printed circuit board assembly 101 may be mounted on one side of the fixed frame 110.

As illustrated in FIGS. 3 and 4, the rotating frame 120 may be rotatably coupled to the fixed frame 110. The rotating frame 120 may accommodate the second printed circuit board assembly 102. The second printed circuit board assembly 102 may be mounted on one side of the rotating frame 120.

The control portion 100 may include a hinge structure to allow the rotating frame 120 to be rotatably coupled to the fixed frame 110. On the other hand, the hinge structure according to an embodiment of the disclosure is not limited to the air conditioner. As well as the air conditioner, the hinge structure according to an embodiment may be applied to household appliances or furniture. However, in the description, for the convenience of description, the hinge structure according to an embodiment will be described in detail with the outdoor unit of the air condition as an example.

In general, the hinge structure requires separate elements in addition to elements to be coupled to each other. For example, a bracket coupled to the rotating frame or the fixed frame may be required in addition to the fixed frame, the rotating frame and the fastening member. As needed, an additional element coupled to the bracket may be required. Therefore, in the conventional manner, the hinge structure needs an additional element in addition to two elements to be hinged. It may lead to increase in the number of elements.

As the number of elements increases, a space occupied by the elements may increase. Therefore, space utilization may be degraded.

Further, the increase in the number of elements causes the increase in production cost and increase in the time required for production. Therefore, productivity may be lowered.

According to embodiments of the disclosure, the hinge structure may be composed of only two elements to be hinged and a fastening member. Accordingly, the number of elements may be reduced and space utilization may be improved. In addition, production costs may be reduced, and the time required for production may be reduced, thereby improving the productivity.

Figure 6:
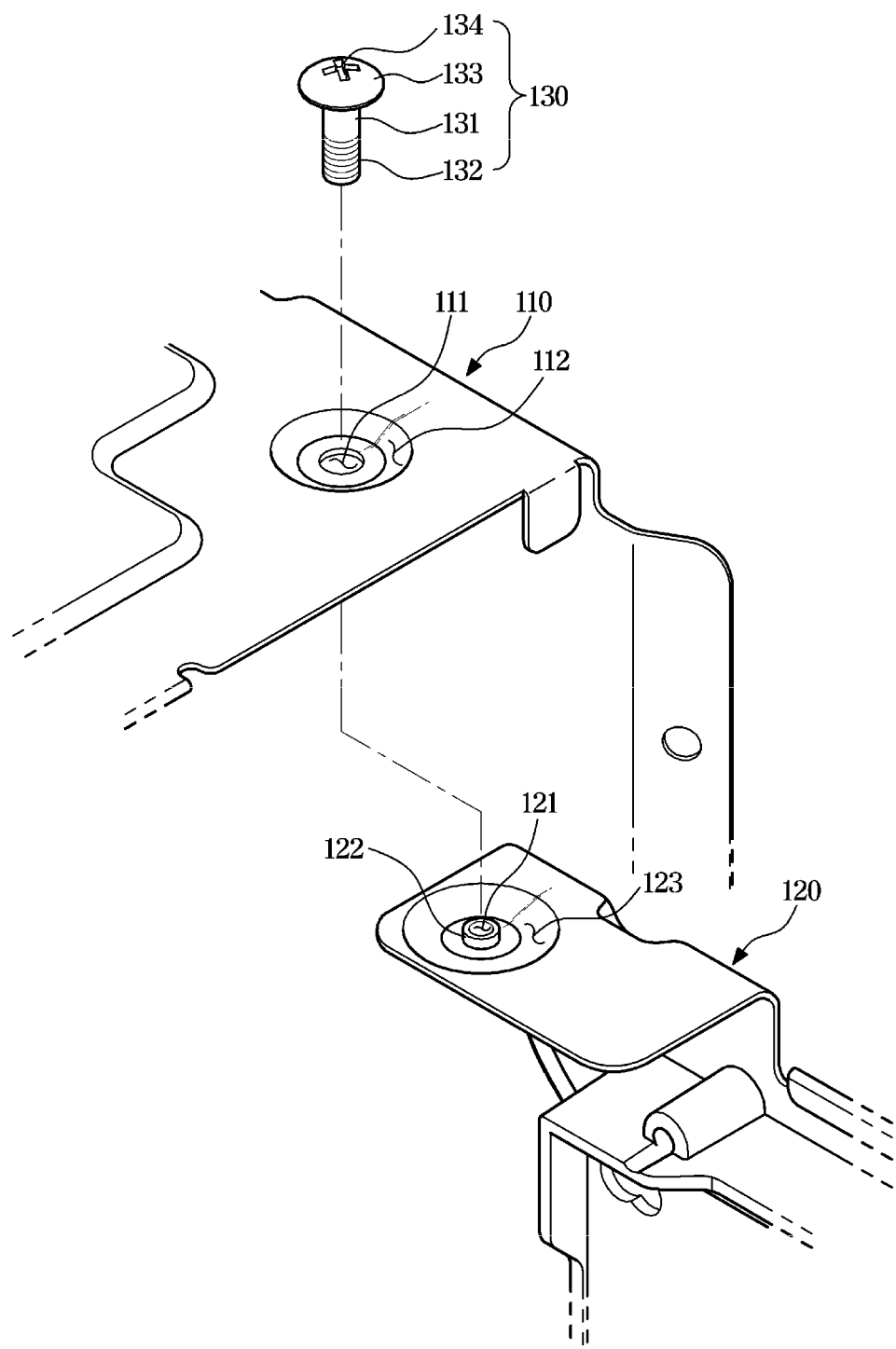
FIG. 6 is an exploded view of a hinge structure in the outdoor unit of the air condition according to an embodiment of the disclosure.
Figure 7:
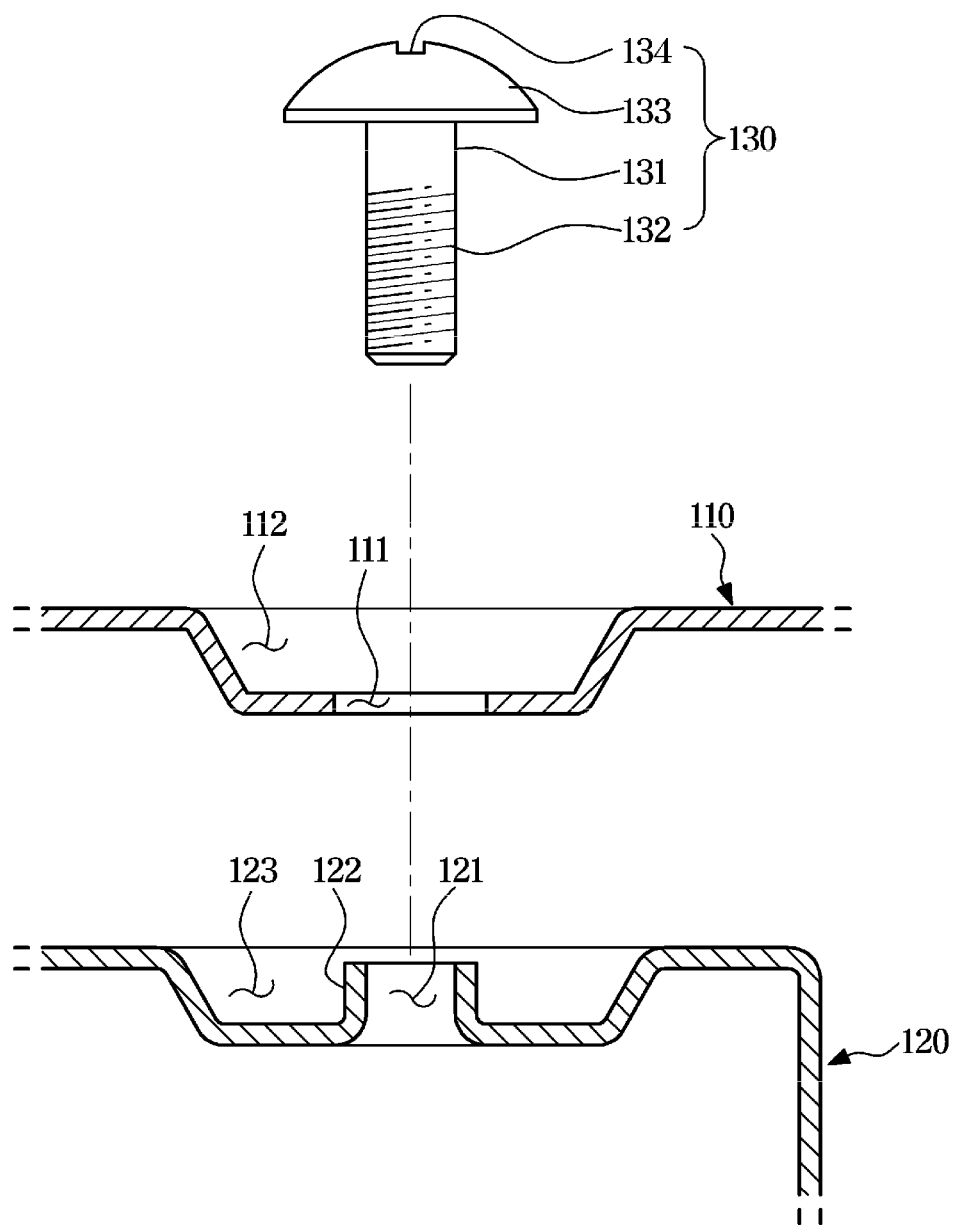
FIG. 7 is a view illustrating a coupling process of the hinge structure in the outdoor unit of the air condition according to an embodiment of the disclosure.
Figure 8:
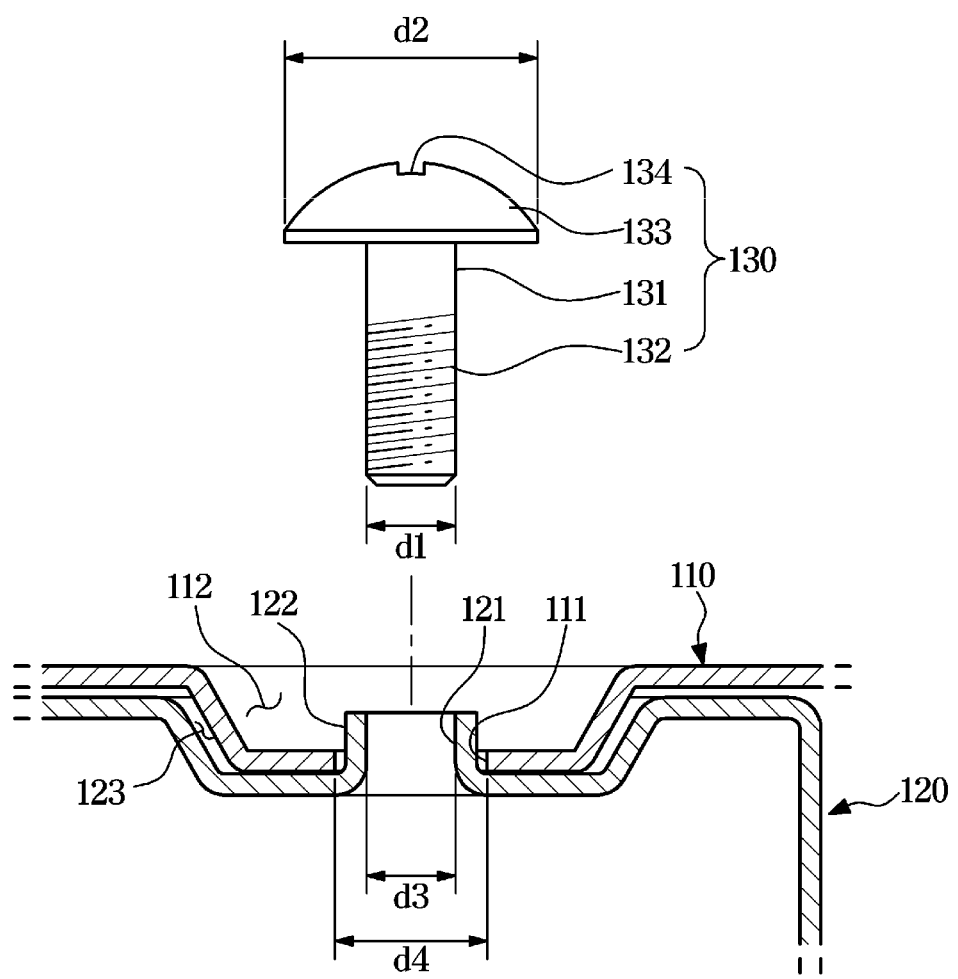
FIG. 8 is a view illustrating the coupling process of the hinge structure in the outdoor unit of the air condition according to an embodiment of the disclosure.
Figure 9:
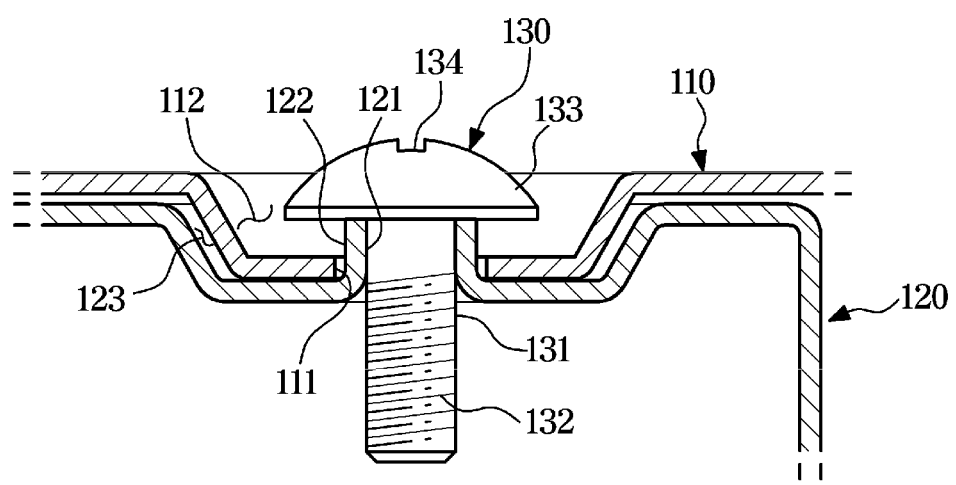
FIG. 9 is a view illustrating the coupling process of the hinge structure in the outdoor unit of the air condition according to an embodiment of the disclosure.

FIG. 5 is an enlarged view of a part A of FIG. 4. FIG. 6 is an exploded view of a hinge structure in the outdoor unit of the air condition according to an embodiment of the disclosure. FIGS. 7 to 9 are views illustrating a coupling process of the hinge structure in the outdoor unit of the air condition according to an embodiment of the disclosure.

Referring to FIGS. 5 and 6, the hinge structure according to an embodiment of the disclosure may be composed of the fixed frame 110, the rotating frame 120 and the fastening member 130.

According to an embodiment of the disclosure, the fixed frame 110 may include a through hole 111. The through hole 111 may be formed to pass through one surface of the fixed frame 110. The through holes 111 may be formed on upper and lower surfaces of the fixed frame 110, respectively. However, the position of the through hole 111 is not limited thereto, and the through hole 111 may be formed at both surfaces of the fixed frame 110.

The rotating frame 120 may be rotatably coupled to the fixed frame 110. The rotating frame 120 may include a burring portion 122 and a burring hole 121 formed by the burring portion 122. The burring portion 122 may protrude toward the fixed frame 110. The burring portion 122 may be inserted into the through hole 111.

The burring portion 122 may be inserted into the through hole 111 in a first direction. The first direction is a vertical direction in the drawing and may indicate a direction from the lower side to the upper side.

At least a portion of the burring portion 122 may pass through the through hole 111 in the first direction. At least a portion of the burring portion 122 may protrude in the first direction about the through hole 111. When a length of the burring portion 122 in the vertical direction is referred to as a height of the burring portion 122, the height of the burring portion 122 may be greater than a thickness of the fixed frame 110 forming the through hole 111.

The fastening member 130 may be coupled to the burring portion 122.

When the fastening member 130 is coupled to the burring portion 122, the fixed frame 110 and the rotating frame 120 may be coupled to each other. More particularly, when the fastening member 130 is inserted into the burring portion 122, the rotating frame 120 may be rotatably coupled to the fixed frame 110.

The fastening member 130 may include a body 131 having a thread 132 formed on an outer surface thereof, and a head 133 formed at one end of the body 131. A diameter $d_2$ of the head 133 may be greater than a diameter $d_1$ of the body 131.

The fastening member 130 may be coupled to the rotating frame 120 because the body 131 is inserted into the burring portion 122. The diameter $d_1$ of the body 131 may be greater than a diameter $d_3$ of the burring hole 121. Accordingly, the body 131 may be forcibly fitted into the burring hole 121.

The thread 132 is provided on the outer surface of the body 131 and thus as the fastening member 130 is rotated by using a fastening portion 134 provided in the head 133, the body 131 may be inserted into the burring hole 121. When the body 131 is inserted into the burring hole 121, the burring portion 122 may be deformed to correspond to the shape of the body 131. As the burring portion 122 is deformed, the fastening member 130 may be stably coupled to the rotating frame 120 without being separated from the rotating frame 120.

The fastening member 130 may be inserted into the burring hole 121 in a second direction opposite to the first direction. The second direction may be a vertical direction in the drawing and may indicate a direction from the upper side to the lower side.

The direction in which the fastening member 130 is inserted into the burring hole 121 may be opposite to the direction in which the burring portion 122 is inserted into the through hole 111.

The fastening member 130 may pass through the burring hole 121 and protrude from the burring hole 121 in the second direction. More particularly, the body 131 may more protrude in the second direction than the burring hole 121.

According to the embodiment of the disclosure, the fixed frame 110 may further include a first recess 112. In addition, the rotating frame 120 may further include a second recess 123.

The first recess 112 may be formed by recessing the periphery of the through hole 111 in the second direction. The second recess 123 may be formed in such a way that the periphery of the burring portion 122 is recessed in the second direction.

The first recess 112 and the second recess 123 may be provided to correspond to each other. The first recess 112 and the second recess 123 may be provided in a shape corresponding to each other. Accordingly, it is easy to correspond the position of the burring hole 121 to the position of the through hole 111 to couple the rotating frame 120 to the fixed frame 110. This is because the positions of the burring hole 121 and the through hole 111 may correspond to each other by matching the first recess 112 with the second recess 123. Accordingly, the first recess 112 and the second recess 123 may facilitate the coupling of the fixed frame 110 and the rotating frame 120 and may reduce the time required for the coupling.

Referring to FIGS. 7 to 9, the rotating frame 120 may be moved in the first direction relative to the fixed frame 110 and then firstly coupled to the fixed frame 110. Alternatively, the rotating frame 120 may be moved in the second direction relative to the fixed frame 110 and then firstly coupled to the fixed frame 110. Particularly, as the burring portion 122 is inserted into the through hole 111, the fixed frame 110 and the rotating frame 120 may be firstly coupled to each other. As the position of the first recess 112 is matched with the position of the second recess 123, the burring portion 122 may be easily inserted into the through-hole 111.

When the rotating frame 120 is firstly coupled to the fixed frame 110, the fastening member 130 may be moved in the second direction so as to be inserted into and coupled to the burring hole 121. As described above, because the fastening portion 134 is rotated after a fastening mechanism (not shown) is coupled to the fastening portion 134, the body 131 may be easily inserted into the burring hole 121. When the body 131 is inserted into the burring hole 121, the burring portion 122 may be deformed. When the burring portion 122 is deformed, a diameter of the burring hole 121 may become the same as a diameter of the body 131.

When the fastening member 130 is inserted into the burring portion 121, the rotating frame 120 may be rotatably coupled to the fixed frame 110. The diameter d2 of the head 133 may be greater than the diameter d4 of the through hole 111. Therefore, the head 133 does not pass through the through hole 111, and thus, the fixed frame 110 is not separated from the rotating frame 120 in the first direction or the second direction.

The fastening member 130 may be provided so as not to be in contact with the fixed frame 110. The fastening member 130 may be arranged to be spaced apart from the fixed frame 110 so as not to be in contact with the fixed frame 110.

In order to form the hinge structure, the above-described hinge structure should be provided in pairs. For the convenience of description, the hinge structure that is provided at the upper portion has been described, but the same hinge structure may be formed at the lower portion of the fixed frame 110 and the rotating frame 120. In the hinge structure formed at the lower portion, the fastening member 130 may not be in contact with the fixed frame 110 because the first recess of the fixed frame supports the second recess of the rotating frame upward. In addition, unlike the drawing, the fixed frame 110 and the rotating frame 120 may also not be in contact with each other.

As illustrated in FIG. 9, when the fastening member 130 is inserted into the burring hole 121, the fastening member 130 may function as a rotary shaft of the rotating frame 120. The rotating frame 120 may rotate against the fixed frame 110 using the fastening member 130 as the rotary shaft.

Figure 10:
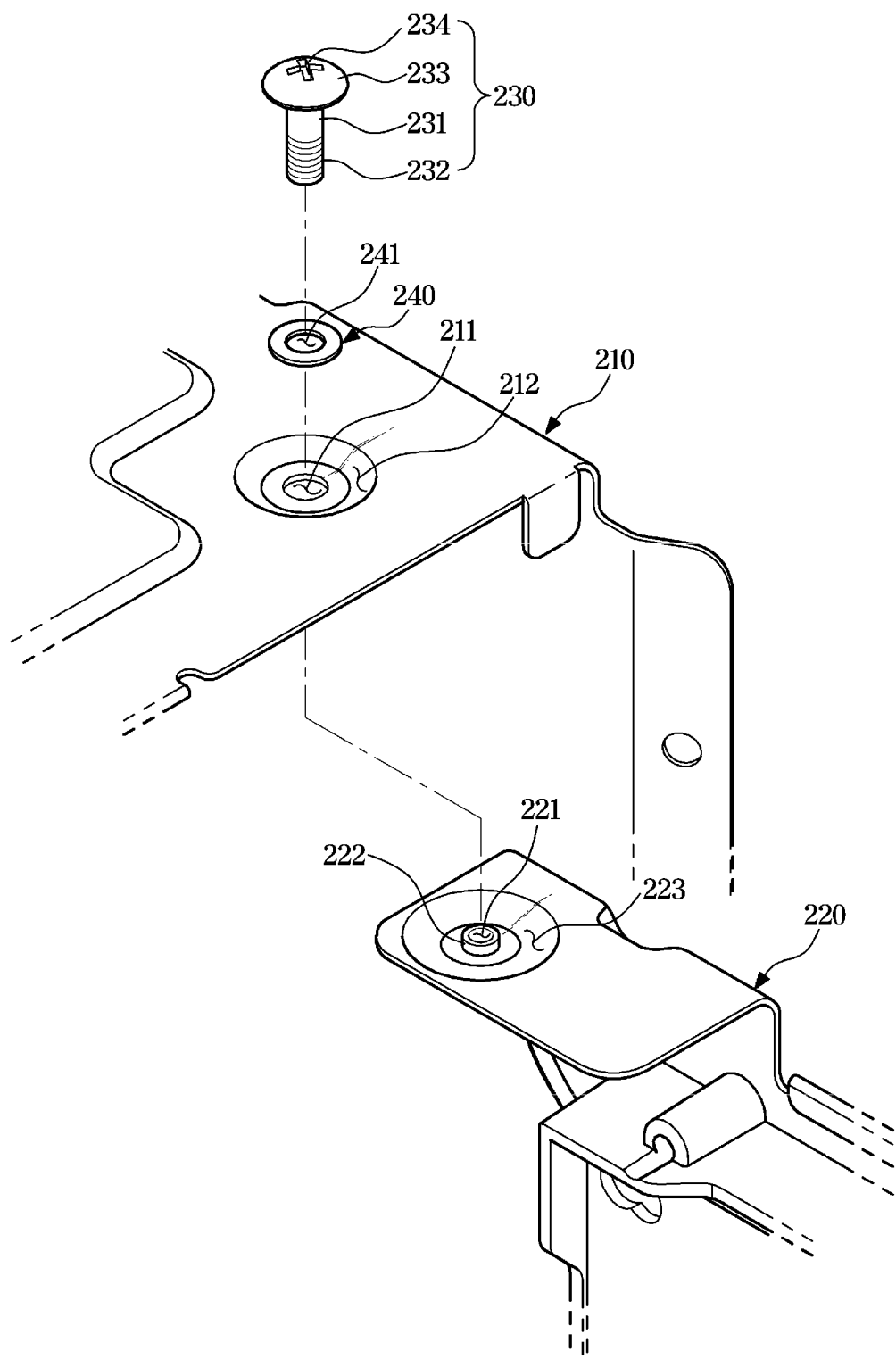
FIG. 10 is an exploded view of a hinge structure in an outdoor unit of an air condition according to an embodiment of the disclosure.
Figure 11:
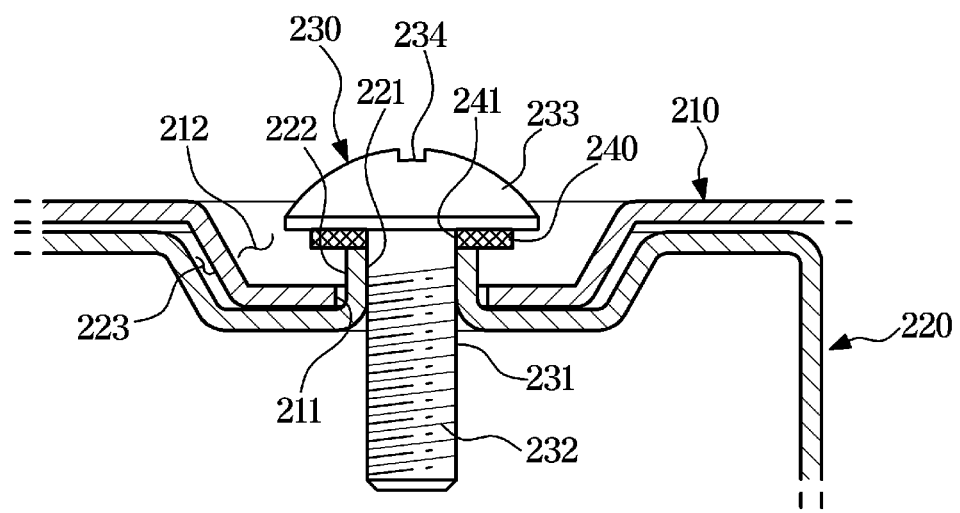
FIG. 11 is a cross-sectional side view of the hinge structure in the outdoor unit of the air condition according to an embodiment of the disclosure.

FIG. 10 is an exploded view of a hinge structure in an outdoor unit of an air condition according to another embodiment of the disclosure. FIG. 11 is a cross-sectional side view of the hinge structure in the outdoor unit of the air condition according to another embodiment of the disclosure.

In the following, a description of the same parts as those described above will be omitted.

Referring to FIGS. 10 and 11, as for an outdoor unit of an air conditioner according to another embodiment of the disclosure, a hinge structure may further include an elastic member 240.

The elastic member 240 may be provided in a ring or donut shape having a central hole 241. The elastic member 240 may be arranged between a burring portion 222 and a fastening member 230. The elastic member 240 may be arranged between the burring portion 222 and the fastening member 230 to prevent the fastening member 230 from being separated from the burring portion 222. When the fastening member 230 is coupled to the burring portion 222, the elastic member 240 arranged between the fastening member 230 and the burring portion 222 may be compressively deformed. As the elastic member 240 is compressively deformed, the coupling force between the fastening member 230 and the burring portion 222 may increase. For example, when the fastening member 230 rotates clockwise to be coupled to the burring portion 222, it is possible to prevent the fastening member 230 from being rotated counterclockwise by the friction force between the elastic member 240 and the fastening member 230 and the friction force between the elastic member 240 and the burring portion 222. Therefore, the fastening member 230 may be prevented from being separated from the burring portion 222 unlike the user's intention. That is, durability may be improved.

A diameter of the central hole 241 of the elastic member 240 may be less than an outer diameter of the burring portion 222 so that the burring portion 222 does not pass through the central hole 241. In addition, the diameter of the central hole 241 of the elastic member 240 may be greater than a diameter of a body 231 so that the body 231 of the fastening member 230 passes through the central hole 241.

In addition, although not shown in the drawings, the elastic member may have a structure as follows.

The diameter of the central hole of the elastic member may be greater than the outer diameter of the burring portion. The elastic member may be provided to surround the outer surface of the burring portion. The elastic member may be arranged between the head of the fastening member and the first recess of the fixed frame. The elastic member may be compressively deformed between the head and the first recess. Through this structure, the elastic member may reduce a clearance in the vertical direction between the fixed frame and the rotating frame. By reducing the clearance between the fixed frame and the rotating frame, it is possible to reduce noise that is generated when the fixed frame is brought into contact with the rotating frame or when the rotating frame rotates about the fixed frame.

Figure 12:
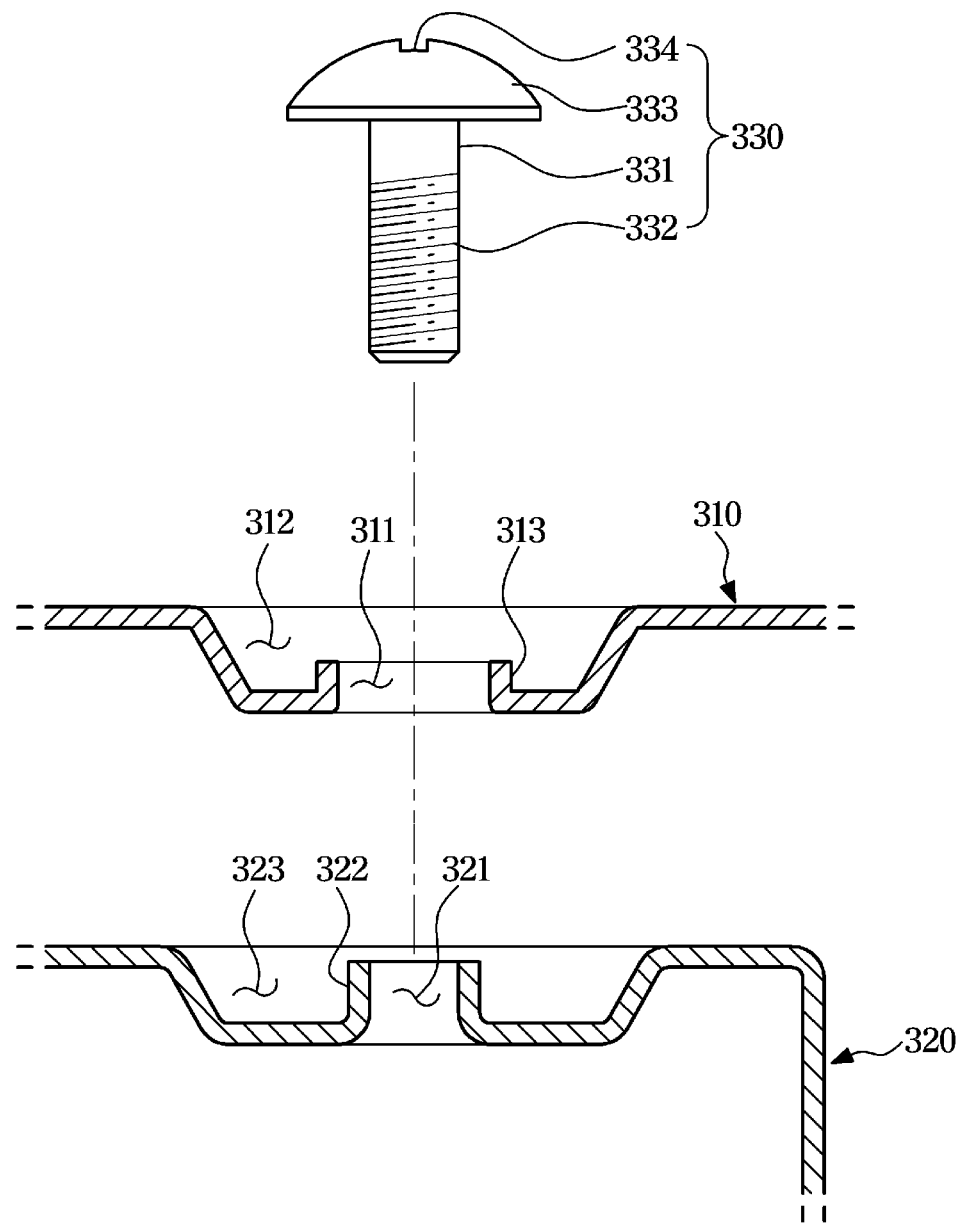
FIG. 12 is a view illustrating a coupling process of a hinge structure in an outdoor unit of an air condition according to an embodiment of the disclosure.
Figure 13:
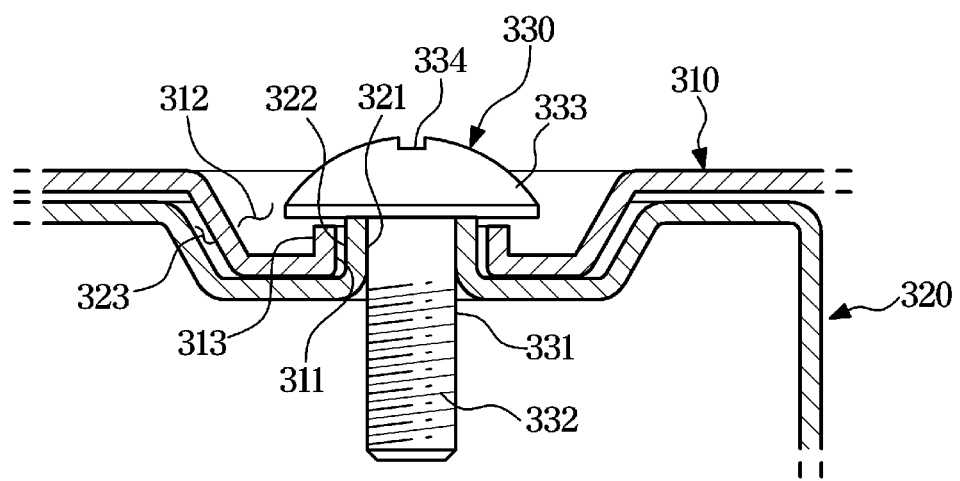
FIG. 13 is a view illustrating the coupling process of the hinge structure in the outdoor unit of the air condition according to an embodiment of the disclosure.

FIGS. 12 and 13 are views illustrating a coupling process of a hinge structure in an outdoor unit of an air condition according to an embodiment of the disclosure.

Referring to FIGS. 12 and 13, a fixed frame according to an embodiment of the disclosure may further include a boss 313.

The boss 313 may be formed in such a way that the periphery of a through hole 311 formed in the fixed frame 310 is bent in a first direction. The first direction may indicate a direction from the lower side to the upper side in the drawings.

The boss 313 may have a structure that is practically identical to the structure of a burring portion 322. However, a height of the boss 313 may be less than a height of the burring portion 322. Therefore, the burring portion 322 may protrude upward from the boss 313 after passing through the through hole 311.

By providing the boss 313, the fixed frame 310 and the rotating frame 320 may be more stably coupled to each other.

Figure 14:
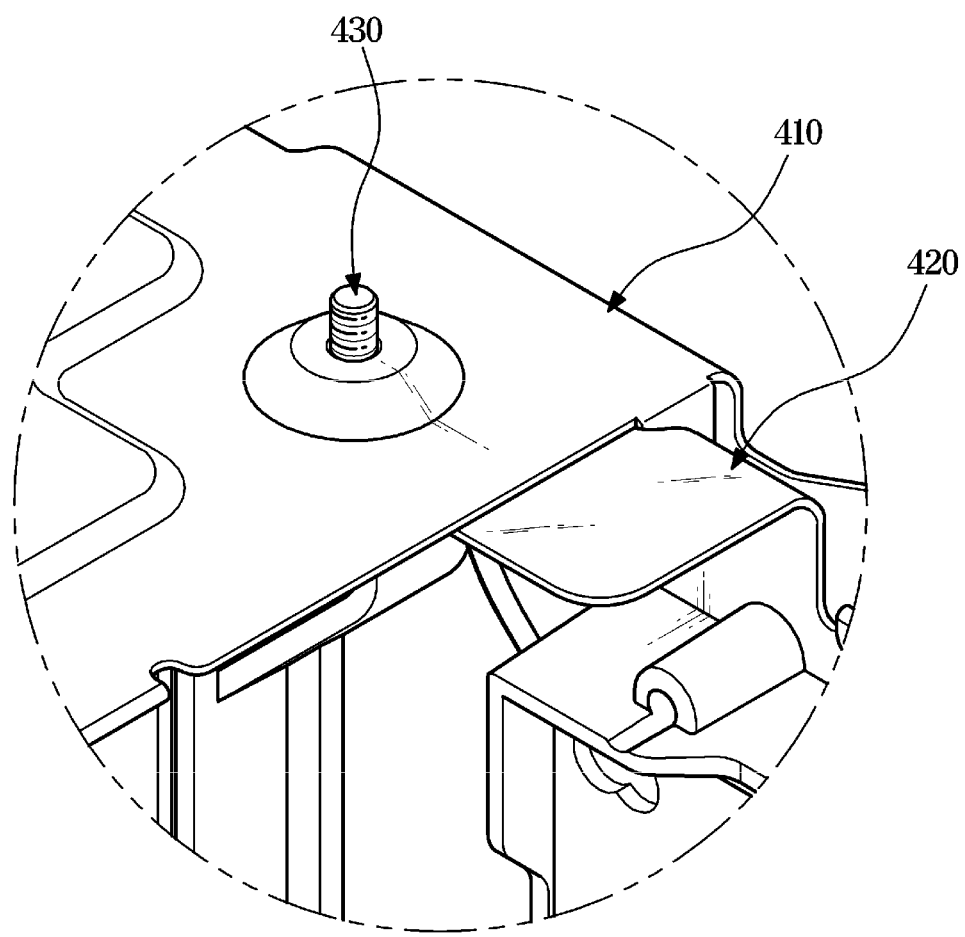
FIG. 14 is an exploded view of a hinge structure in an outdoor unit of an air condition according to an embodiment of the disclosure.
Figure 15:
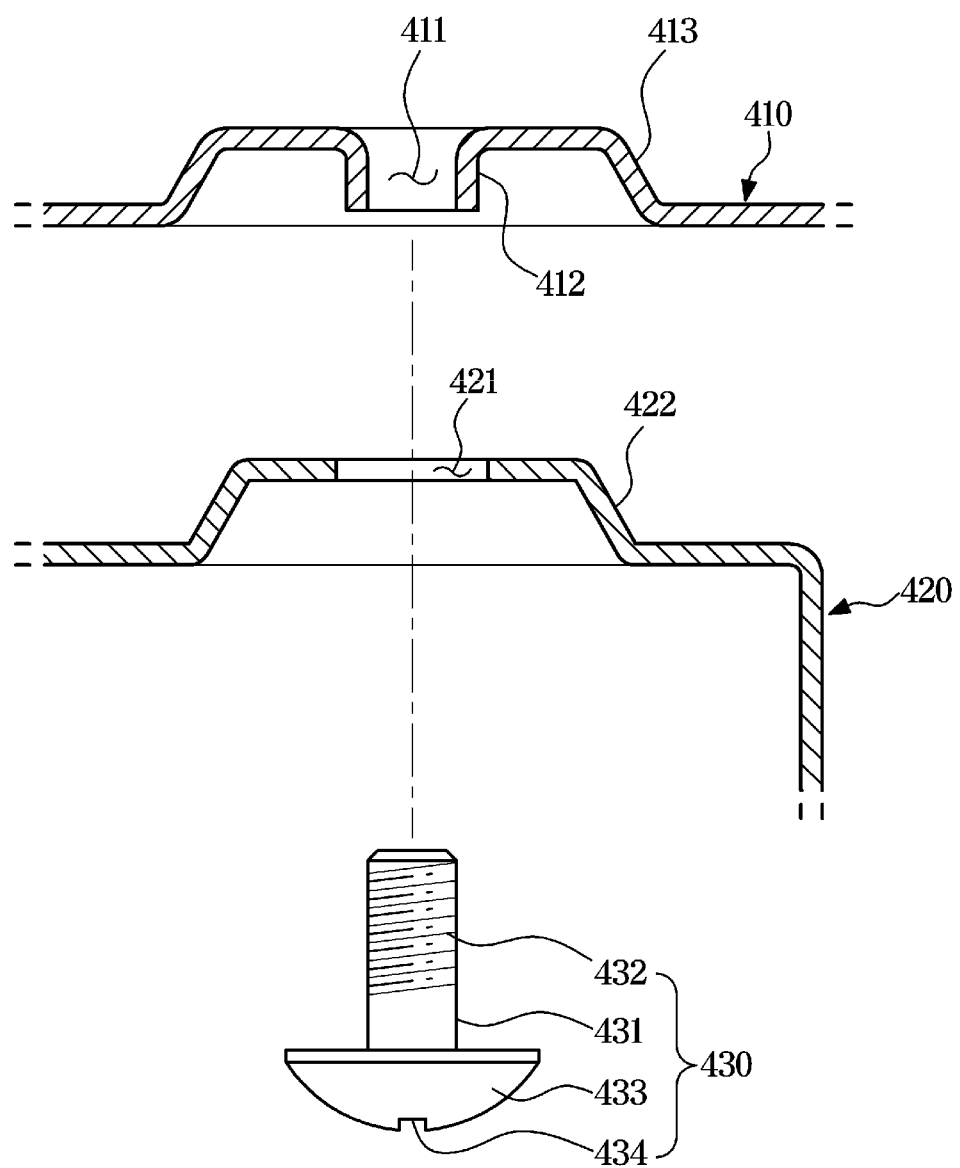
FIG. 15 is a view illustrating a coupling process of a hinge structure in an outdoor unit of an air condition according to an embodiment of the disclosure.
Figure 16:
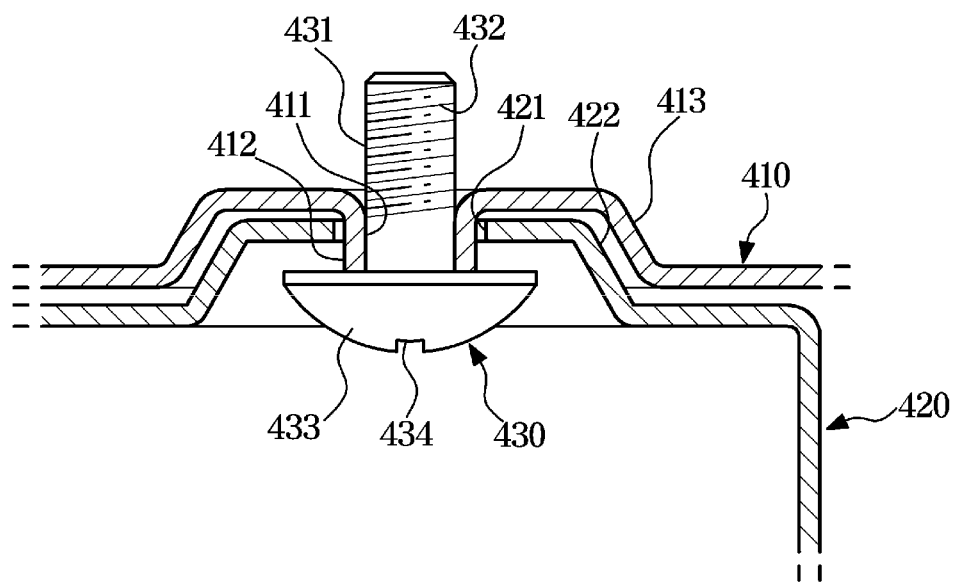
FIG. 16 is a view illustrating the coupling process of the hinge structure in the outdoor unit of the air condition according to an embodiment of the disclosure.

FIG. 14 is an exploded view of a hinge structure in an outdoor unit of an air condition according to an embodiment of the disclosure. FIGS. 15 and 16 are views illustrating a coupling process of a hinge structure in an outdoor unit of an air condition according to an embodiment of the disclosure.

Referring to FIGS. 14 to 16, in an outdoor unit of an air conditioner according to an embodiment of the disclosure, a hinge structure may be provided in such a way that a fastening member 430 is coupled to a rotating frame 420 from the lower side to the upper side.

A fixed frame 410 may include a burring portion 412 and a burring hole 411 formed by the burring portion 412. In addition, the fixed frame 410 may include a first protrusion 413 formed in such a way that the periphery of the burring portion 412 protrudes upward.

The rotating frame 420 may include a through hole 421. In addition, the rotating frame 420 may include a second protrusion 422 formed in such a way that the periphery of the through hole 421 protrudes upward.

The fastening member 430 may be inserted into the burring portion 412 from the lower side to the upper side. The burring portion 412 may pass through the through hole 421 and then protrude downward from the through hole 421. The fastening member 430 may move upward and be inserted into the burring hole 411.

According to an embodiment of the disclosure, although a hinge structure is different from the above mentioned hinge structure, it is possible to reduce the number of elements and to improve space utilization.

Figure 17:
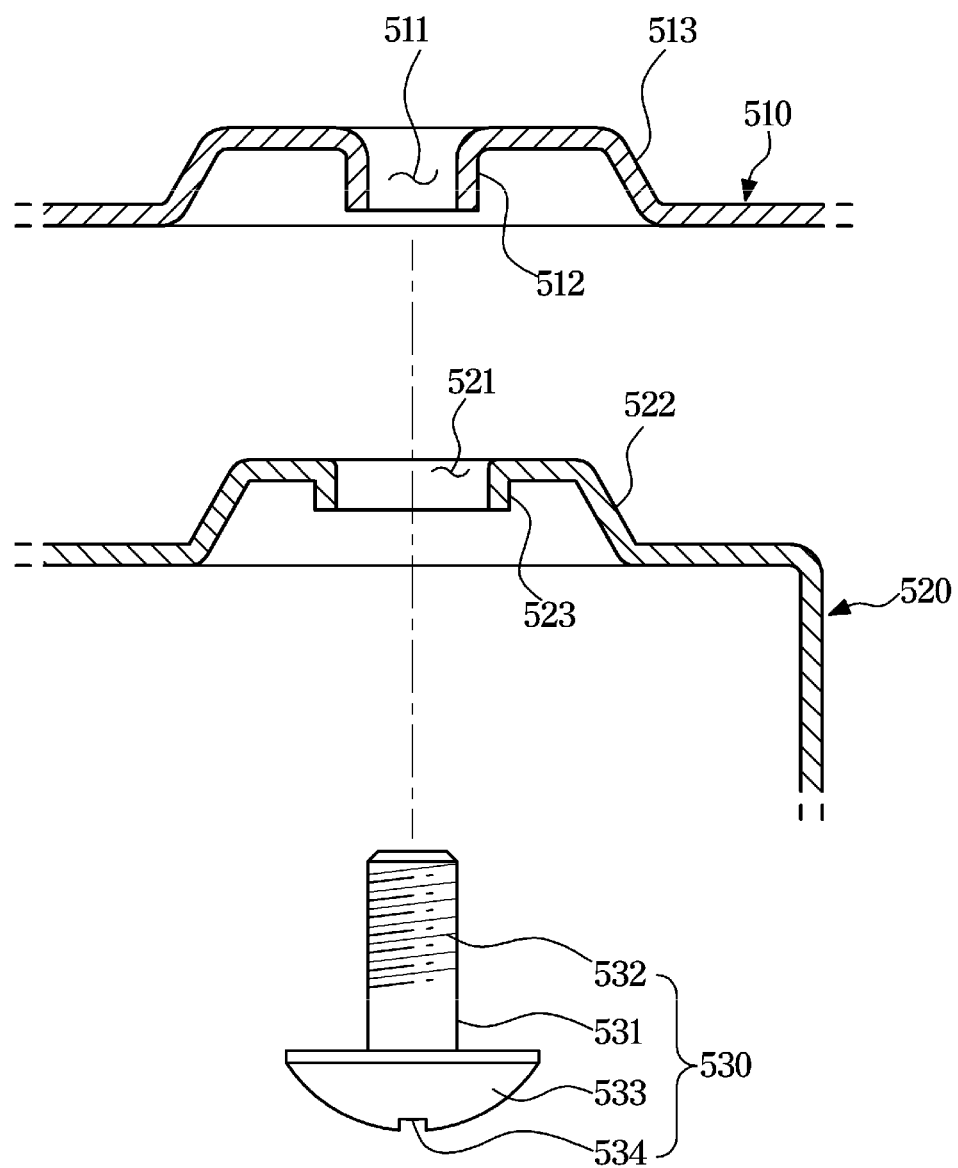
FIG. 17 is a view illustrating a coupling process of a hinge structure in an outdoor unit of an air condition according to an embodiment of the disclosure.
Figure 18:
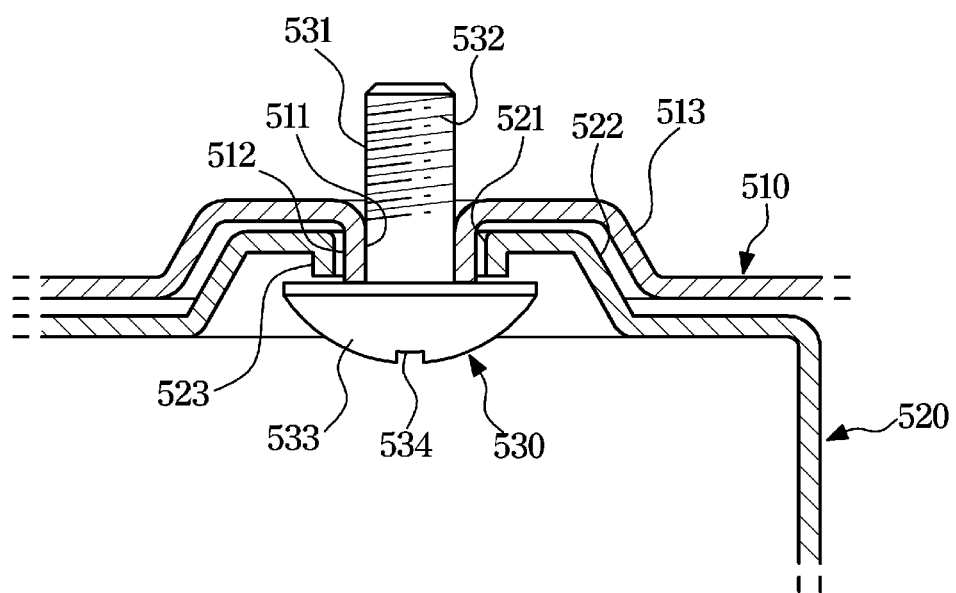
FIG. 18 is a view illustrating the coupling process of the hinge structure in the outdoor unit of the air condition according to an embodiment of the disclosure.

FIGS. 17 and 18 are views illustrating a coupling process of a hinge structure in an outdoor unit of an air condition according to an embodiment of the disclosure.

According to an embodiment of the disclosure, a rotating frame 520 may further include a boss 523 formed in such a way that the periphery of a through hole 521 is bent downward.

The boss 523 may be formed in such a way that the periphery of the through hole 521 formed in the rotating frame 520 is bent in a second direction. The second direction may indicate a direction from the upper side to the lower side in the drawing.

The boss 523 may have a structure that is practically identical to the structure of a burring portion 512. However, a height of the boss 523 may be less than a height of the burring portion 512. Therefore, the burring portion 512 may protrude downward from the boss 523 after passing through the through hole 511.

By providing the boss 523, the fixed frame 510 and the rotating frame 520 may be more stably coupled to each other.

On the other hand, although not shown in the drawings, the elastic member may be included in all of the various embodiments of the disclosure. For example, in FIG. 17, the elastic member may be arranged between the burring portion 512 and the fastening member 530, thereby reducing noise.

As is apparent from the above description, it is possible to provide the outdoor unit including the hinge structure having reduced number of elements and improved space utilization, and an air conditioner including the outdoor unit.

Although a few embodiments of the disclosure have been shown and described, it would be appreciated by those skilled in the art that changes may be made in these embodiments without departing from the principles and spirit of the disclosure, the scope of which is defined in the claims and their equivalents,

What is claimed is:
1. An air conditioner comprising:
a first frame including a through-hole;
a second frame rotatably couplable to the first frame, the second frame including:
   a burring portion comprising a burring hole formed therein, the burring portion having at least a portion of which is insertable into the through-hole of the first frame in a first direction; and
a fastening member insertable into the burring hole in a second direction which is opposite to the first direction, the fastening member configured to function as a rotary shaft of the second frame,
wherein:
   while the fastening member is inserted into the burring hole, the fastening member protrudes in the second direction;
   the first frame further comprises a first recess portion formed around a periphery of the through-hole and recessed in the second direction;
   the second frame further comprises a second recess portion formed around a periphery of the burring portion and recessed in the second direction;
   the first recess portion and the second recess portion correspond to each other to guide the burring portion to be inserted into the through-hole; and when the first frame is coupled to the second frame, the burring portion is inserted into the through-hole, resided within a space formed by the first recess portion, and does not extend to an outer surface of the first frame.

2. The air conditioner of claim 1, wherein
the fastening member is arranged to be spaced apart from the first frame so as not to be in contact with the first frame when the fastening member secures the first frame and the second frame together.

3. The air conditioner of claim 1, wherein
the fastening member comprises a body having a thread formed on an outer surface thereof and a head provided in one end of the body and having a diameter greater than a diameter of the body.

4. The air conditioner of claim 3, wherein
the diameter of the body is greater than a diameter of the burring hole.

5. The air conditioner of claim 3, wherein
a diameter of the through-hole is less than the diameter of the head to prevent the fastening member from passing through the through-hole.

6. The air conditioner of claim 1, wherein
the first frame further comprises a boss formed around a periphery of the through-hole is bent in the first direction.

7. The air conditioner of claim 6, wherein
the burring portion protrudes more than the boss in the first direction.

8. The air conditioner of claim 1, further comprising:
an elastic member arranged between the burring portion and the fastening member and comprising a central hole through which the fastening member penetrates.

9. The air conditioner of claim 8, wherein
a diameter of the central hole is less than an outer diameter of the burring portion to prevent the burring portion from passing through the central hole.

10. The air conditioner of claim 1, further comprising:
a first printed circuit board assembly and a second printed circuit board assembly different from the first printed circuit board assembly,
wherein the first printed circuit board assembly is mounted to the first frame, and the second printed circuit board assembly is mounted to the second frame.

11. The air conditioner of claim 1, wherein a top surface of the burring portion protruding from the first frame has a height lower than a height of the outer surface of the first frame.

12. An outdoor unit of an air conditioner comprising:
a first frame on which a printed circuit board assembly is mounted and including a through-hole;
a second frame rotatably couplable to the first frame, the second frame including:
a burring portion comprising a burring hole formed therein, the burring portion having at least a portion of which is insertable into the through-hole of the first frame in a first direction; and
a fastening member insertable into the burring hole in a second direction opposite to the first direction to function as a rotary shaft of the second frame,
wherein:
when the burring portion is inserted into the through-hole of the first frame, the burring portion passes through the through-hole to protrude from the first frame in the first direction;
the first frame further comprises a first recess portion formed around a periphery of the through-hole and recessed in the second direction;
the second frame further comprises a second recess portion formed around a periphery of the burring portion and recessed in the second direction;
the first recess portion and the second recess portion correspond to each other to guide the burring portion to be inserted into the through-hole; and
when the first frame is coupled to the second frame, the burring portion is inserted into the through-hole, resided within a space formed by the first recess portion, and does not extend to an outer surface of the first frame.

13. The air conditioner of claim 12, wherein a top surface of the burring portion protruding from the first frame has a height lower than a height of the outer surface of the first frame.

* * * * *